United States Patent
Wu et al.

(10) Patent No.: US 11,804,463 B2
(45) Date of Patent: Oct. 31, 2023

(54) UNDERFILL FOR CHIP PACKAGING AND CHIP PACKAGING STRUCTURE

(71) Applicant: Wuhan Choice Technology Co, Ltd, Wuhan (CN)

(72) Inventors: De Wu, Wuhan (CN); Shengquan Wang, Wuhan (CN); Yi Wang, Wuhan (CN); Shuhang Liao, Wuhan (CN); Junxing Su, Wuhan (CN)

(73) Assignee: Wuhan Choice Technology Co, Ltd, Wuhan (CN)

( * ) Notice: Subject to any disclaimer, the term of this patent is extended or adjusted under 35 U.S.C. 154(b) by 0 days.

(21) Appl. No.: 18/307,569

(22) Filed: Apr. 26, 2023

(65) Prior Publication Data

US 2023/0260948 A1   Aug. 17, 2023

Related U.S. Application Data

(63) Continuation of application No. PCT/CN2022/095506, filed on May 27, 2022.

(30) Foreign Application Priority Data

Jul. 27, 2021   (CN) .......................... 202110849534.1

(51) Int. Cl.
| | |
|---|---|
| *H01L 23/00* | (2006.01) |
| *C08G 59/40* | (2006.01) |
| *C08L 63/00* | (2006.01) |
| *C09J 163/00* | (2006.01) |
| *C08G 59/62* | (2006.01) |
| *C09J 11/04* | (2006.01) |

(Continued)

(52) U.S. Cl.
CPC .......... *H01L 24/29* (2013.01); *C08G 59/4007* (2013.01); *H01L 24/16* (2013.01); *H01L 24/32* (2013.01); *H01L 24/73* (2013.01); *H01L 2224/16221* (2013.01); *H01L 2224/2929* (2013.01); *H01L 2224/29387* (2013.01); *H01L 2224/32221* (2013.01); *H01L 2224/73204* (2013.01); *H01L 2924/0665* (2013.01)

(58) Field of Classification Search
None
See application file for complete search history.

(56) References Cited

FOREIGN PATENT DOCUMENTS

| CN | 113292957 A |   | 8/2021 |
| JP | 2004131610 A | * | 4/2004 |
| JP | 2004131610 A |   | 4/2004 |

(Continued)

*Primary Examiner* — Randy P Gulakowski
*Assistant Examiner* — Ha S Nguyen
(74) *Attorney, Agent, or Firm* — Nitin Kaushik

(57) ABSTRACT

The present application discloses an underfill for chip packaging, including 19-25% of epoxy resin, 55-60% of filler, 15-25% of curing agent and 0.5-0.8% of accelerator in mass percentage, wherein the curing agent includes a polycondensate of paraxylene and dihydroxynaphthalene and a polycondensate of paraxylene and naphthol. Both of the polycondensate of paraxylene and dihydroxynaphthalene and the polycondensate of paraxylene and naphthol are selected to be used in the underfill for chip packaging in the present application, so that the underfill has stronger adhesiveness after being cured. In addition, the present application further provides a chip packaging structure using the underfill.

8 Claims, 1 Drawing Sheet

(51) Int. Cl.
*H01L 23/29* (2006.01)
*C08K 3/36* (2006.01)

(56) References Cited

FOREIGN PATENT DOCUMENTS

| | | | | |
|---|---|---|---|---|
| JP | 2015003982 A | 1/2015 | | |
| WO | WO-2017022721 A1 * | 2/2017 | ............. | C08G 59/62 |

* cited by examiner

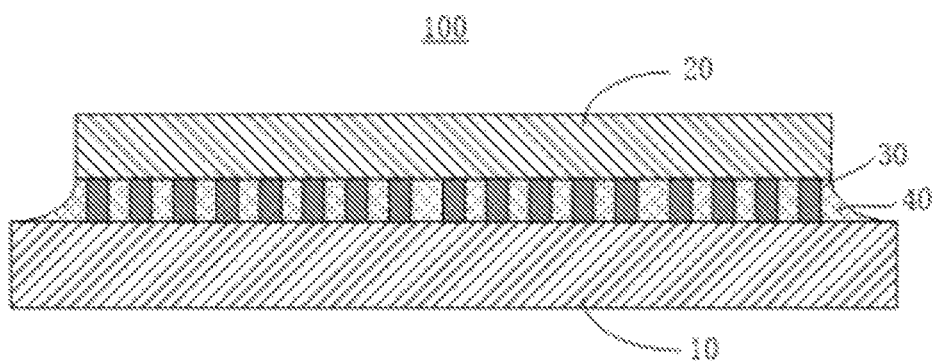

UNDERFILL FOR CHIP PACKAGING AND CHIP PACKAGING STRUCTURE

CROSS-REFERENCE TO RELATED APPLICATIONS

The application claims priority to Chinese patent application No. CN202110849534.1, filed on Jul. 27, 2021, the entire contents of which are incorporated herein by reference.

BACKGROUND

A flip chip means that a solder joint is connected to a substrate by soldering to achieve the conduction of a circuit after a semiconductor chip is flipped. This method is different form a traditional method which is to perform wire bonding around a chip and connect the chip to a circuit board by a gold wire or a copper wire. The flip chip has the advantages of small size and transmission loss reduction due to a shorter solder joint than that of a traditional gold wire so as to be higher in signal transmission speed and better in heat conduction effect at the same time.

In order to meet a requirement on the reliability of an electronic device, an underfill technology is generally adopted for the flip chip. An underfill is a material suitable for the underfill technology for the flip chip, it generally permeates into gaps between the chip and the substrate on the basis of a principle of a capillary effect, and then, it is gradually solidified by thermal curing and is filled in the gaps between the chip and the substrate to protect high-density solder bumps between the chip and the substrate and the chip. By using the underfill for chip bottom packaging, expansion coefficient dismatching between the chip and the substrate can be lowered, the chip can be protected from impacts from harmful operation environments such as mechanical stretching, shearing, twisting and vibration, and thus, the reliability and long-term usability of the chip are improved. Therefore, the underfill is required to have excellent electrical, physical and mechanical properties.

After the underfill is filled in the gaps between the chip and the substrate and cured to form an underfill material, the underfill material is adhered to the chip, the substrate and the solder bumps located between the chip and the substrate, thereby protecting the chip, the substrate and the solder bumps. However, the adhesion between the underfill material formed after an existing underfill is cured and each of the chip, the substrate and the solder bumps is not strong enough, the situation that the underfill material is cracked or peeled off from the chip, the substrate and/or the solder bumps often occurs, the chip cannot be further protected, and thus, the chip is damaged.

SUMMARY

The present application provides an underfill to relieve the problem of relatively poor adhesion of an existing underfill.

Embodiments of the present application are implemented in such a way: provided is an underfill for chip packaging, including 19-25% of epoxy resin, 55-60% of filler, 15-25% of curing agent and 0.5-0.8% of accelerator in mass percentage, wherein the curing agent includes a polycondensate (a curing agent (1)) of paraxylene and dihydroxynaphthalene and a polycondensate (a curing agent (2)) of paraxylene and naphthol, wherein the polycondensate of paraxylene and dihydroxynaphthalene has a structural formula shown as follows:

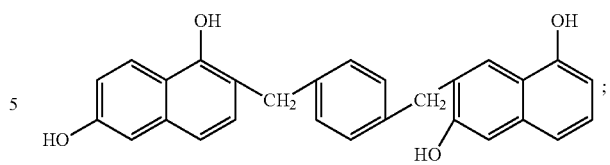

and the polycondensate of paraxylene and naphthol has a structural formula shown as follows:

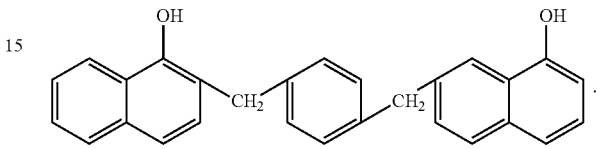

Optionally, in some embodiments of the present application, a mass ratio of the curing agent (1) to the curing agent (2) is within a range of (1:0.5)-(1:2).

Optionally, in some embodiments of the present application, a hydroxyl equivalent of the curing agent (1) is within a range of 150-300, and a hydroxyl equivalent of the coring agent (2) is within a range of 100-200.

Optionally, in some embodiments of the present application, a hydroxyl equivalent of the epoxy resin is within a range of 50-100.

Optionally, in some embodiments of the present application, the epoxy resin is selected from at least one of bisphenol A epoxy resin, bisphenol F epoxy resin, bisphenol S epoxy resin and hydrogenated bisphenol A epoxy resin.

Optionally, in some embodiments of the present application, the filler is silica.

Optionally, in some embodiments of the present application, the average particle size of silica is 0.1-100 μm.

Optionally, in some embodiments of the present application, the accelerator is selected from at least one of an imidazole latent accelerator and an amine latent accelerator.

Optionally, in some embodiments of the present application, the underfill further includes 0.1-0.3% of pigment in mass percentage.

Correspondingly, embodiments of the present application further provide a chip packaging structure including a substrate, a chip disposed on the substrate and a plurality of spaced solder bumps formed between the substrate and the chip, wherein gaps among the solder bumps between the substrate and the chip are filled with an underfill material, and the underfill material is formed after the above-mentioned underfill is cured.

The curing agent of the underfill for chip packaging in the present application is selected from at least one of the curing agent (1) and the curing agent (2), so that the underfill has stronger adhesiveness after being completely cured. In addition, the underfill has stronger adhesion due to a synergistic effect among the components in specific ratios. Therefore, the underfill material formed after the underfill is cured has stronger adhesion to the chip, the substrate and the solder bumps, the situation of cracking cannot occur, and the underfill material can better fix and protect the chip, so that the chip has high reliability and long-term usability.

BRIEF DESCRIPTION OF DRAWINGS

In order to describe the technical solutions in the embodiments of the present application more clearly, the accompanying drawings required for describing the embodiments will be briefly introduced below. Apparently, the accompanying drawings in the following description show only some embodiments of the present application, and those skilled in the art may still derive other accompanying drawings from these accompanying drawings without creative efforts.

FIG. 1 is a schematic structural diagram of a chip packaging structure provided in embodiments of the present application.

DETAILED DESCRIPTION OF THE EMBODIMENTS

The technical solutions in the embodiments of the present application will be clearly and completely described below. Apparently, the described embodiments are only a part of the embodiments of the present application, but not all of the embodiments. Based on the embodiments of the present application, all other embodiments obtained by those skilled in the art without creative effort shall fall within the protection scope of the present application. In addition, it should be understood that the implementations described herein are only intended to describe and explain the present application, rather than to limit the present application. In the description of the present application, the term "including" refers to "including, but not limited to". Various embodiments of the present application can exist in a form of a range. It should be understood that the description in a form of a range is only for the purposes of convenience and simplicity and should not be understood as an inflexible limitation on the scope of the present application. Therefore, it should be considered that all possible sub-ranges and a single value in the range have been specifically disclosed in the description for the range. For example, it should be considered that sub-ranges such as 1-3, 1-4, 1-5, 2-4, 2-6 and 3-6 and a single number such as 1, 2, 3, 4, 5 and 6 within a range to which the single number belongs have been specifically disclosed in the description for the range from 1 to 6, and it is applicable regardless of the range. In addition, a value range indicated herein refers to any referenced numbers (fractions or integers) within the referred range.

Embodiments of the present application provide an underfill for chip packaging, including 19-25% of epoxy resin, 55-60% of filler, 15-25% of curing agent, 0.1-0.3% of pigment and 0.5-0.8% of accelerator in mass percentage.

The epoxy resin can be selected from, but is not limited to at least one of bisphenol A epoxy resin, bisphenol F epoxy resin, bisphenol S epoxy resin and hydrogenated bisphenol A epoxy resin. The epoxy resin contains hydroxyls, and a hydroxyl equivalent is within a range of 50-100, such as 50-80, or 60-90, or 80-100; for example, it can be 50, 60, 85, 90 and 100. Within the range of the hydroxyl equivalent, the epoxy resin has stronger adhesion.

The filler can be silica. The average particle size of silica is 0.1-100 μm. It can be understood that modified silica with different particle sizes can be selected to be used according to gaps between a chip and a packaging substrate and/or among solder bumps. For example, when the gaps are within the range of 100 μm, the particle size of the modified silica is preferably 0.1-5 μm; when the gaps between the chip and the packaging substrate are within the range of 50-100 μm, the particle size of the modified silica is preferably 0.1-2 μm; and when the gaps between the chip and the packaging substrate are within the range of 6-15 μm, the particle size of the modified silica is preferably 0.1-0.3 μm.

The curing agent includes a polycondensate (a curing agent (1)) of paraxylene and dihydroxynaphthalene and a polycondensate (a curing agent (2)) of paraxylene and naphthol.

The polycondensate of paraxylene and dihydroxynaphthalene has a structural formula shown as follows:

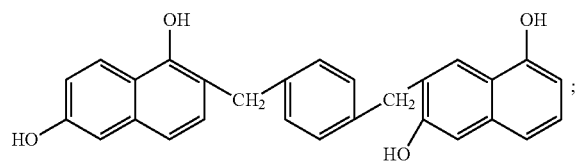 [SMILES: Oc1ccc2c(O)c(Cc3ccc(Cc4cc5c(O)cccc5cc4O)cc3)ccc2c1]

and
the polycondensate of paraxylene and naphthol has a structural formula shown as follows:

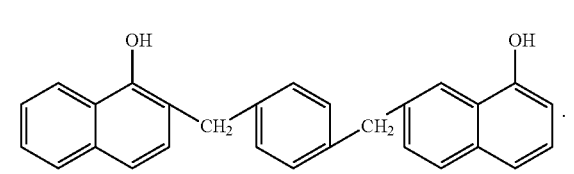 [SMILES: Oc1cccc2ccc(Cc3ccc(Cc4ccc5ccccc5c4O)cc3)cc12]

A hydroxyl equivalent of the curing agent (1) is within a range of 150-300, such as 150-200, or 180-250, or 160-300. A hydroxyl equivalent of the curing agent (2) is within a range of 100-200, such as 100-150, or 120-180, or 160-200. Due to the addition of the curing agent (1) and the curing agent (2), the underfill has stronger adhesiveness after being cured.

A mass ratio of the curing agent (1) to the curing agent (2) is within a range of (1:0.5)-(1:2), such as (1:0.5)-(1:1), or (1:0.8)-(1:1.2), or (1:1.1)-(1:1.6), or (1:1.5)-(1:2). Within the ratio range, the underfill has stronger adhesiveness.

The pigment is a known pigment, such as carbon black, used as an underfill in the art. The pigment can make the underfill present different appearances.

The accelerator can be selected from, but is not limited to at least one of an imidazole latent accelerator and an amine latent accelerator. For example, the amine latent accelerator can be benzyl dimethylamine, etc. The accelerator has the functions of lowering the curing temperature and prolonging the material storage time and can ensure that the multifunctional epoxy resin does not react at normal temperature, but has the maximum adhesion after being heated.

The curing agent of the underfill for chip packaging in the present application is selected from at least one of the curing agent (1) and the curing agent (2), so that the underfill has stronger adhesiveness after being completely cured. In addition, due to a synergistic effect among the components in specific ratios of the underfill with stronger adhesion, the adhesion of the underfill is further enhanced.

In at least one embodiment, a preparation method of the underfill with stronger adhesion includes the following steps:

step S1: the epoxy resin, the filler, the curing agent, the pigment and the accelerator are added into a stirring glass according to a certain ratio;

step S2: a centrifugal stirrer is adopted for stirring for 90-300 s at a rotation speed of 800 r/min and a revolution speed of 1200 r/min to obtain a mixture;

step S3: the mixture is added into a three-roller grinder for roller grinding to obtain a uniformly-disposed underfill, wherein three rollers of the three-roller grinder have a feeding gap of 30-60 μm and a discharging gap of 10-30 μm; and step S4: the centrifugal stirrer is used to perform vacuum defoamation on the uniformly-dispersed underfill, wherein the vacuum defoamation time is 30-60 s, and the centrifugal stirrer has the rotation speed of 800 r/min and the revolution speed of 1200 r/min.

Refer to FIG. 1, embodiments of the present application further provide a chip packaging structure 100 including a substrate 10, a chip 20 disposed on the substrate 10 and a plurality of spaced solder bumps 30 formed between the substrate 10 and the chip 20. Gaps among the solder bumps 30 between the substrate 10 and the chip 20 are filled with an underfill material 40. The underfill material 40 is formed after the underfill for chip packaging is cured.

In at least one embodiment, the solder bumps 30 are made of a high-copper material, that is, the mass percentage of copper in the material for making the solder bumps 30 is within a range of 1.4-1.8%.

The underfill material 40 filled in the gaps among the solder bumps 30 of the chip packaging structure 100 is formed after the underfill for chip packaging is cured, the underfill for chip packaging has stronger adhesion, and therefore, the underfill material 40 has stronger adhesion to the chip 20, the substrate 10 and the solder bumps 30, the situation of cracking cannot occur, and the underfill material 40 can better fix and protect the chip 20, so that the chip 20 has high reliability and long-term usability.

The present application will be specifically described below with specific embodiments, and the following embodiments are only parts of the embodiments of the present application, but are not intended to limit the present application.

Embodiment 1

Silica 60%
Complex high-tech material EPLS-818S (bisphenol A, hydroxyl equivalent 80) 24.4%
Curing agent (1) 8%
Curing agent (2) 7%
Carbon black 0.1%
Benzyl dimethylamine 0.5%

Embodiment 2

Silica 55%
Complex high-tech material EPLS-818S (bisphenol A, hydroxyl equivalent 80) 19.4%
Curing agent (1) 13%
Curing agent (2) 12%
Carbon black 0.1%
Benzyl dimethylamine 0.5%

Embodiment 3

Silica 58%
Complex high-tech material EPLS-818S (bisphenol A, hydroxyl equivalent 80) 21.4%
Curing agent (1) 10%
Curing agent (2) 10%
Carbon black 0.1%
Benzyl dimethylamine 0.5%

Embodiment 4

Silica 60%
Complex high-tech material EPLS-818S (bisphenol A, hydroxyl equivalent 80) 24.4%
Curing agent (1) 15%
Carbon black 0.1%
Benzyl dimethylamine 0.5%

Embodiment 5

Silica 55%
Complex high-tech material EPLS-818S (bisphenol A, hydroxyl equivalent 80) 19.4%
Curing agent (1) 25%
Carbon black 0.1%
Benzyl dimethylamine 0.5%

Embodiment 6

Silica 58%
Complex high-tech material EPLS-818S (bisphenol A, hydroxyl equivalent 80) 21.4%
Curing agent (1) 20%
Carbon black 0.1%
Benzyl dimethylamine 0.5%

Embodiment 7

Silica 60%
Complex high-tech material EPLS-818S (bisphenol A, hydroxyl equivalent 80) 24.4%
Curing agent (2) 15%
Carbon black 0.1%
Benzyl dimethylamine 0.5%

Embodiment 8

Silica 55%
Complex high-tech material EPLS-818S (bisphenol A, hydroxyl equivalent 80) 19.4%
Curing agent (2) 25%
Carbon black 0.1%
Benzyl dimethylamine 0.5%

Embodiment 9

Silica 58%
Complex high-tech material EPLS-818S (bisphenol A, hydroxyl equivalent 80) 21.4%
Curing agent (2) 20%
Carbon black 0.1%
Benzyl dimethylamine 0.5%

Comparative Example 1

Silica 63%
Complex high-tech material EPLS-818S (bisphenol A, hydroxyl equivalent 80) 26.4%
Curing agent (1) 10%
Carbon black 0.1%
Benzyl dimethylamine 0.5%

Comparative Example 2

Silica 62.6%
Complex high-tech material EPLS-818S (bisphenol A, hydroxyl equivalent 80) 26%
Curing agent (2) 10%
Carbon black 0.4%
Benzyl dimethylamine 1%

Comparative Example 3

Silica 58%
Complex high-tech material EPLS-818S (bisphenol A, hydroxyl equivalent 80) 21.4%
Methylhexahydrophthalic anhydrid (hydroxyl equivalent 0) 20%
Carbon black 0.1%
Benzyl dimethylamine 0.5%

Comparative Example 4

Silica 58%
Complex high-tech material EPLS-818S (bisphenol A, hydroxyl equivalent 80) 21.4%
2-methylimidazol (hydroxyl equivalent 0) 20%
Carbon black 0.1%
Benzyl dimethylamine 0.5%

Comparative Example 5

Silica 58%
Complex high-tech material EPLS-818S (bisphenol A, hydroxyl equivalent 80) 21.4%
M-phenylenediamine (hydroxyl equivalent 0) 20%
Carbon black 0.1%
Benzyl dimethylamine 0.5%

Copper adhesion test is performed on the underfill for chip packaging in embodiments 1-9 and the underfill in the comparative examples 1-5. A test method includes: a square lattice with a size of 4×4 mm is adhered to a copper sheet with a length of 5 cm, a width of 1 cm and a thickness of 0.1 cm by using a polytetrafluoroethylene adhesive tape, the prepared underfill is uniformly coated in the square lattice, another new copper sheet is used to be fitted thereto and is fixed by a clip, and after thermal curing is performed for 1 h at the temperature of 150° C., an adhesion strength of the underfill to copper is tested on a universal tensile testing machine, and a test result refers to table 1 shown as follows.

TABLE 1

| | Initial Cu adhesion strength/ MPa | Cu adhesion/ MPa obtained after PCT 168 h high-temperature and high-pressure digester test (120° C./ 100% RH/2 atm, 168 h) | Conclusion obtained by PCT 168 h high-temperature and high-pressure digester test | MSL3 and TCB1000 (−55° C. to −125° C.) | MSL3 and TCC200 (−5° C. to −150° C.) |
|---|---|---|---|---|---|
| Embodiment 1 | 54 | 40 | Pass: not separating from the substrate | Pass: not separating from the substrate | Pass: not separating from the substrate |
| Embodiment 2 | 57 | 51 | Pass: not separating from the substrate | Pass: not separating from the substrate | Pass: not separating from the substrate |
| Embodiment 3 | 60 | 53 | Pass: not separating from the substrate | Pass: not separating from the substrate | Pass: not separating from the substrate |
| Embodiment 4 | 45 | 40 | Pass: not separating from the substrate | Pass: not separating from the substrate | Pass: not separating from the substrate |
| Embodiment 5 | 48 | 45 | Pass: not separating from the substrate | Pass: not separating from the substrate | Pass: not separating from the substrate. |
| Embodiment 6 | 50 | 49 | Pass: not separating from the substrate | Pass: not separating from the substrate | Pass: not separating from the substrate |
| Embodiment 7 | 37 | 35 | Pass: not separating from the substrate | Pass: not separating from the substrate | Pass: not separating from the substrate |
| Embodiment 8 | 40 | 38 | Pass: not separating from the substrate | Pass: not separating from the substrate | Pass: not separating from the substrate |
| Embodiment 9 | 44 | 40 | Pass: not separating from the substrate | Pass: not separating from the substrate | Pass: not separating from the substrate |
| Comparative example 1 | 35 | 26 | Fail: separating from the substrate and cracking | Fail: separating from the substrate and cracking | Fail: separating from the substrate and cracking |
| Comparative example 2 | 36 | 27 | Fail: separating from the substrate and cracking | Fail: separating from the substrate and cracking | Fail: separating from the substrate and cracking |
| Comparative example 3 | 24 | 15 | Fail: separating from the substrate and cracking | Fail: separating from the substrate and cracking | Fail: separating from the substrate and cracking |
| Comparative example 4 | 20 | 9 | Fail: separating from the substrate and cracking | Fail: separating from the substrate and cracking | Fail: separating from the substrate and cracking |

TABLE 1-continued

| | Initial Cu adhesion strength/ MPa | Cu adhesion/ MPa obtained after PCT 168 h high-temperature and high-pressure digester test (120° C./ 100% RH/2 atm, 168 h) | Conclusion obtained by PCT 168 h high-temperature and high-pressure digester test | MSL3 and TCB1000 (−55° C. to −125° C.) | MSL3 and TCC200 (−5° C. to −150° C.) |
|---|---|---|---|---|---|
| Comparative example 5 | 30 | 21 | Fail: separating from the substrate and cracking | Fail: separating from the substrate and cracking | Fail: separating from the substrate and cracking |

Wherein RH represents a relative humidity; atm represents a standard atmospheric pressure; MSL3 and TCB1000 (−55° C. to −125° C.) represent that a thermal cycle at high and low temperatures of −55° C. to −125° C. is performed for one thousand times under the condition that the grade of moisture sensitivity is 3; and MSL3 and TCC200 (−65° C. to −150° C.) represent that a thermal cycle at high and low temperatures of −65° C. to −150 ° C. is performed for one thousand times under the condition that the grade of moisture sensitivity is 3.

It can be known from the above-mentioned table that the underfill for chip packaging in embodiments 1-3 has stronger adhesion than the underfill for chip packaging in embodiments 4-9, The underfill for chip packaging in embodiments 1-9 has stronger adhesion than the underfill in comparative examples 1-5, cannot be separated from the substrate and cannot be cracked.

The underfill for chip packaging provided in the embodiments of the present application has been introduced in detail as above. Specific individual examples are applied herein to describe the principle and implementations of the present application. The descriptions of the above-mentioned embodiments are only intended to help understand the method and core concept of the present application. At the same time, those skilled in the art may, based on the concept of the present application, make modifications with respect to the specific implementations and the application scope. In conclusion, the content of this specification shall not be understood as a limitation on the present application.

The invention claimed is:

1. An underfill for chip packaging, comprising 19-25% of epoxy resin, 55-60% of filler, 15-25% of curing agent and 0.5-0.8% of accelerator in mass percentage, wherein the curing agent comprises a polycondensate of paraxylene and dihydroxynaphthalene and a polycondensate of paraxylene and naphthol, and a mass ratio of the polycondensate of paraxylene and dihydroxynaphthalene to the polycondensate of paraxylene and naphthol is within a range of (1:0.5)-(1:2), wherein the polycondensate of paraxylene and dihydroxynaphthalene has a structural formula shown as follows:

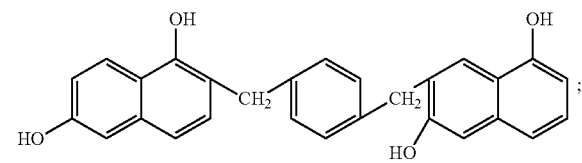 [SMILES: Oc1ccc2c(O)c(Cc3ccc(Cc4cc5c(O)cccc5cc4O)cc3)ccc2c1]

and the polycondensate of paraxylene and naphthol has a structural formula shown as follows:

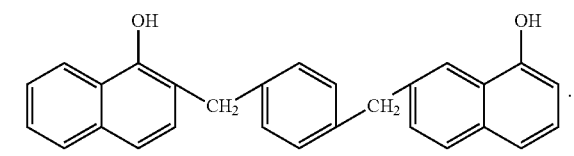 [SMILES: Oc1cccc2ccc(Cc3ccc(Cc4ccc5ccccc5c4O)cc3)cc12]

2. The underfill of claim 1, wherein a hydroxyl equivalent of the epoxy resin is with a range of 50-100.

3. The underfill of claim 1, wherein the epoxy resin is selected from at least one of bisphenol A epoxy resin, bisphenol F epoxy resin, bisphenol S epoxy resin and hydrogenated bisphenol A epoxy resin.

4. The underfill of claim 1, wherein the filler is silica.

5. The underfill of claim 4, wherein the average particle size of silica is 0.1-100 μm.

6. The underfill of claim 1, wherein the accelerator is selected from at least one of an imidazole latent accelerator and an amine latent accelerator.

7. The underfill of claim 1, wherein the underfill further comprises a pigment, and the mass percentage of the pigment in the underfill is 0.1-0.3%.

8. A chip packaging structure, comprising a substrate, a chip disposed on the substrate and a plurality of spaced solder bumps formed between the substrate and the chip, gaps among the solder bumps between the substrate and the chip being filled with an underfill material, wherein the underfill material is formed after the underfill of claim 1 is cured.

* * * * *